United States Patent
Piazzi et al.

(10) Patent No.: US 9,584,166 B2
(45) Date of Patent: Feb. 28, 2017

(54) SYSTEM AND METHOD FOR NULL FILLING OF IQ WAVEFORM

(71) Applicant: Futurewei Technologies, Inc., Plano, TX (US)

(72) Inventors: Leonard Piazzi, Denville, NJ (US); Zhengxiang Ma, Summit, NJ (US)

(73) Assignee: FUTUREWEI TECHNOLOGIES, INC., Plano, TX (US)

( * ) Notice: Subject to any disclaimer, the term of this patent is extended or adjusted under 35 U.S.C. 154(b) by 0 days.

(21) Appl. No.: 14/704,393

(22) Filed: May 5, 2015

(65) Prior Publication Data

US 2015/0333780 A1    Nov. 19, 2015

Related U.S. Application Data

(60) Provisional application No. 61/994,659, filed on May 16, 2014.

(51) Int. Cl.
| | |
|---|---|
| H04L 25/06 | (2006.01) |
| H04B 1/04 | (2006.01) |
| H03F 3/19 | (2006.01) |
| H03F 3/21 | (2006.01) |
| H04B 1/40 | (2015.01) |
| H04L 25/08 | (2006.01) |
| H03F 1/02 | (2006.01) |
| H03F 3/24 | (2006.01) |

(52) U.S. Cl.
CPC .......... *H04B 1/0475* (2013.01); *H03F 1/0294* (2013.01); *H03F 3/19* (2013.01); *H03F 3/21* (2013.01); *H03F 3/245* (2013.01); *H04B 1/40* (2013.01); *H04L 25/08* (2013.01); *H03F 2200/336* (2013.01); *H04B 2001/0416* (2013.01)

(58) Field of Classification Search
CPC ............... H04B 1/0475; H04B 2001/0416; H04L 25/08
USPC ........................................................ 375/297
See application file for complete search history.

(56) References Cited

U.S. PATENT DOCUMENTS

| | | | |
|---|---|---|---|
| 5,627,486 A | 5/1997 | Gross | |
| 2011/0021165 A1* | 1/2011 | Lee | H04L 27/3411 455/127.5 |
| 2013/0147559 A1 | 6/2013 | Schaffer | |

FOREIGN PATENT DOCUMENTS

WO    2013009823 A1    1/2013

OTHER PUBLICATIONS

International Search Report issued in corresponding PCT application No. PCT/CN2015/079074, dated Jul. 29, 2015, total 11 pages.

\* cited by examiner

*Primary Examiner* — David S Huang
(74) *Attorney, Agent, or Firm* — Futurewei Technologies, Inc.

(57) ABSTRACT

System and method embodiments are provided for null filling of IQ waveform. In an embodiment method, samples below a predetermined threshold are selected from a plurality of samples of an input signal. Amplitude values of a complex null-fill function are then calculated to push amplitudes of the samples below the predetermined threshold to a signal level at the predetermined threshold. The phase values of the complex null-fill function are calculated to push the samples of the input signal in an IQ plane in a defined direction from a point closest to a zero signal value. The resulting complex null-fill function is filtered within a predetermined bandwidth of the input signal, and then added to the input signal to provide a modified input signal for amplification.

19 Claims, 15 Drawing Sheets

SYSTEM AND METHOD FOR NULL FILLING OF IQ WAVEFORM

This application claims the benefit of U.S. Provisional Application No. 61/994,659 filed on May 16, 2014 by Leonard Piazzi et al. and entitled "System and Method for Null Filling of IQ Waveform," which is hereby incorporated herein by reference as if reproduced in its entirety.

TECHNICAL FIELD

The present invention relates to wireless communications, and, in particular embodiments, to a system and method for null filling of IQ waveform.

BACKGROUND

For certain amplifier architectures in wireless systems, the null signal cannot be re-created properly after the signal is passed through the amplifier, which leads to both in-band signal degradation and out-of-band emissions. This is caused by any impairment imbalance between the decomposed signal paths prior to amplification. The impairment can be a gain or amplitude imbalance, a phase imbalance, or both amplitude and phase imbalance between the constant envelope signal paths. Even a relatively small amplitude or phase imbalance between the decomposed paths can lead to significant output signal degradation for in-bound and out-bound frequencies. An effective approach to address such imbalance is needed.

SUMMARY OF THE INVENTION

In accordance with an embodiment, a method by a signal processor for handling a null signal in a power amplifier includes determining a minimum threshold value of an input signal to a power amplifier. The minimum threshold value is retrievable with defined acceptable error in an output signal of the power amplifier. The method further includes generating an offset function according to the minimum threshold value. The offset function is added to the input signal prior to amplifying the input signal.

In accordance with another embodiment, a method by a power amplifier circuit for handling a null signal in a power amplifier includes identifying, from a plurality of samples of an input signal, samples below a predetermined threshold. The method further includes calculating amplitude values of a complex null-fill function that raise amplitudes of the identified samples to a signal level at the predetermined threshold, and calculating phase values of the complex null-fill function that push, in an IQ plane, the samples of the input signal in a defined direction from a point closest to a zero signal value. The complex null-fill function is filtered within a predetermined bandwidth of the input signal, and then added to the input signal, to generate a modified input signal.

In accordance with yet another embodiment, a power amplifier circuit for handling a null signal comprises a signal processor configured to determine a minimum threshold value of an input signal. The minimum threshold value is retrievable with defined acceptable error in an output signal of the power amplifier. The signal processor is further configured to generate an offset function according to the minimum threshold value. The power amplifier circuit can optionally include a noise filter coupled to the signal processor, the noise filter optionally being configured to filter the offset function within a predetermined bandwidth of the input signal. The filtering reduces out-of-band emissions in the output signal. The power amplifier circuit can optionally further include a signal coupler coupled to the noise filter, the noise filter being configured to add the offset function to the input signal, and provide a modified input signal.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Preferred embodiments are discussed in detail below. It should be appreciated, however, that the present invention provides many applicable inventive concepts that can be embodied in a wide variety of specific contexts. The specific embodiments discussed are merely illustrative of specific implementations to make and use the invention, and do not limit the scope of the invention.

System and method embodiments are provided for null filling of IQ waveform. The embodiments ensure recreating a proper null signal after the amplification step in a signal processing system, thus preventing or reducing in-band signal degradation and out-of-band emissions. This is achieved using a null filling algorithm which ensures that no signal below a certain threshold is sent through the amplifier, thereby avoiding the recreating of the null signal after the amplification step. Blank or almost blank subframes can be handled by adding a relatively very low level signal to the subframe to ensure that a minimum level signal level is present corresponding to the hole punch level.

Figure 1:
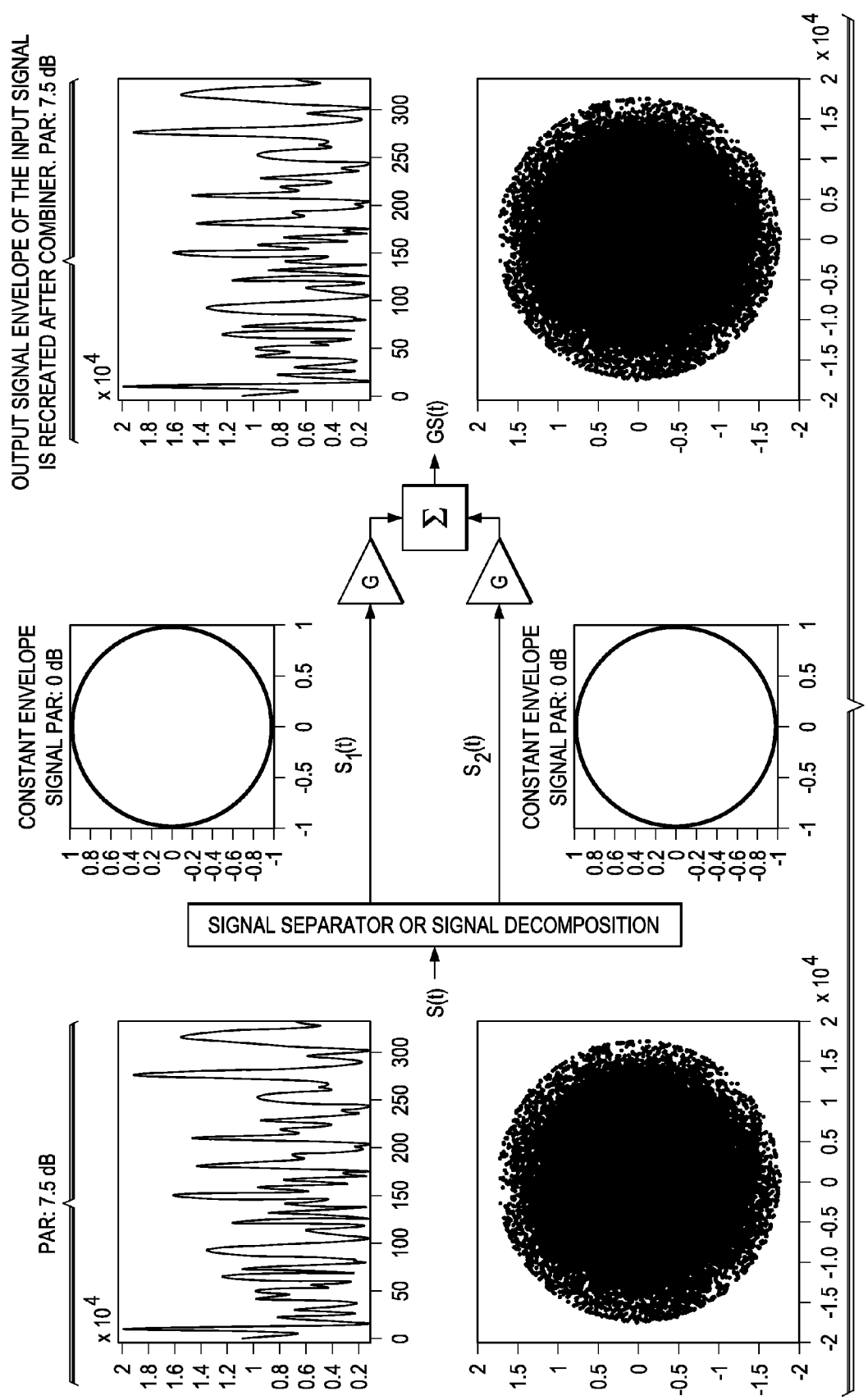
FIG. 1 illustrates a linear amplification using non-linear components (LINC) architecture.

Linear amplification systems including non-linear components are used in wireless systems (such as transmitters) to create highly efficient and highly configurable power amplifiers. FIG. 1 shows linear amplification using a non-linear component (LINC) architecture that employs a signal decomposition method which takes an amplitude varying signal and creates at least two constant envelope signals (S1 and S2). The constant envelope signals are then added together to reconstruct the amplitude variation of the original signal. Plots of signal magnitude over time and in the IQ plane are also shown for both the original signal, S, and the amplified output signal, GS. The IQ plane is a translation of amplitude and phase data from a polar coordinate system to a cartesian (x,y) coordinate system. The x-axis in the IQ plane is referred to as I for real values, and the y-axis is referred to as Q for imaginary values.

Figure 2:
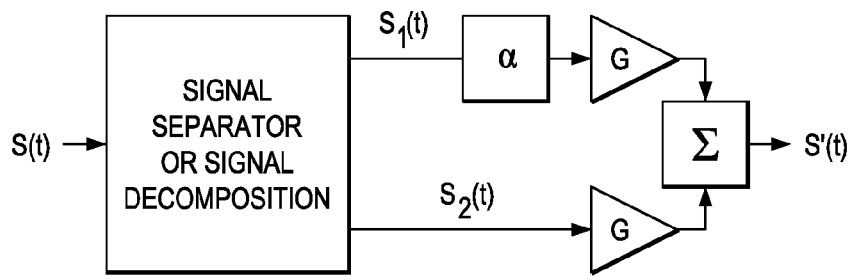
FIG. 2 illustrates a model of impairment imbalance between the decomposed signal paths.
Figure 3:
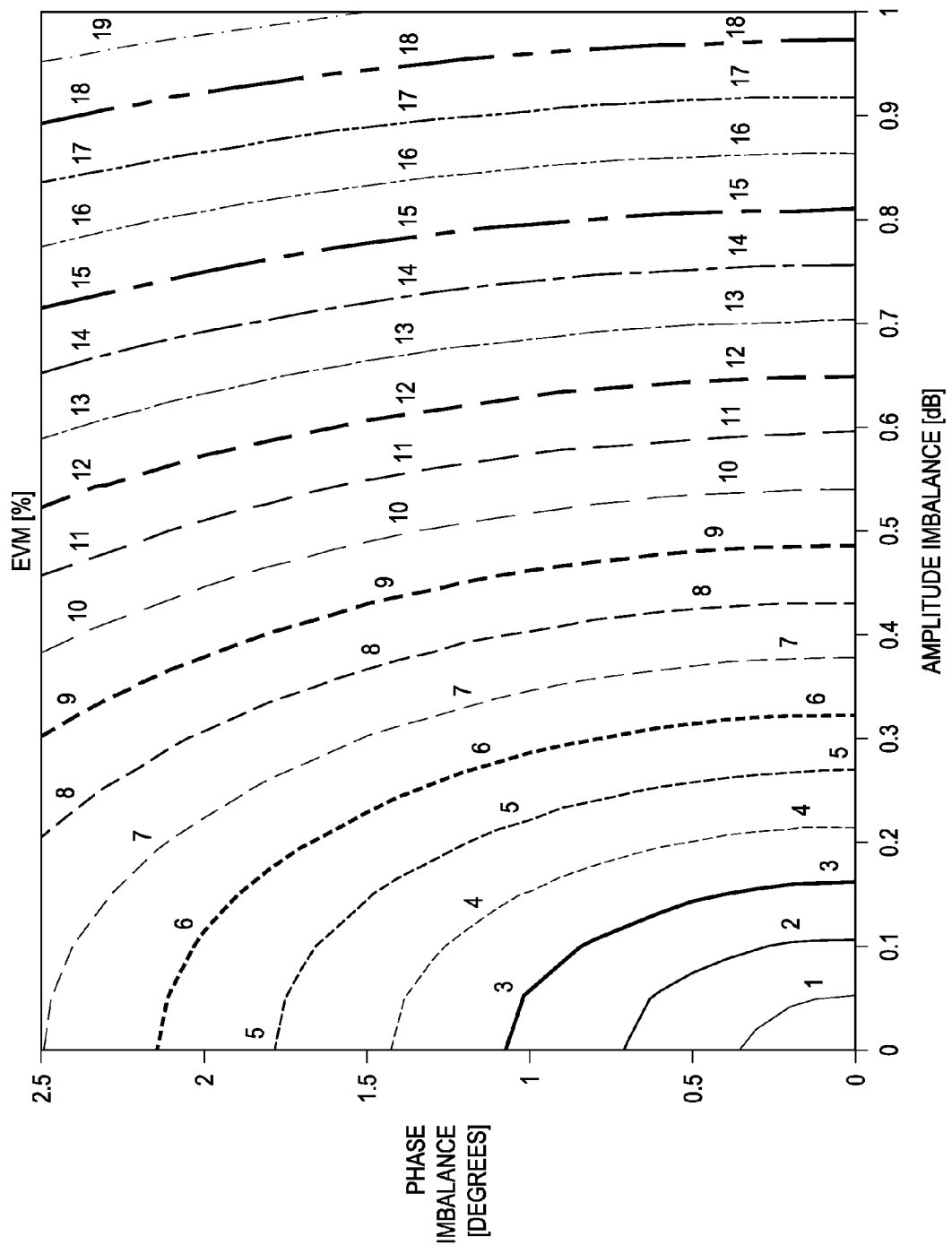
FIG. 3 illustrates error vector magnitude (EVM) of an output signal with phase imbalance and amplitude imbalance.
Figure 4:
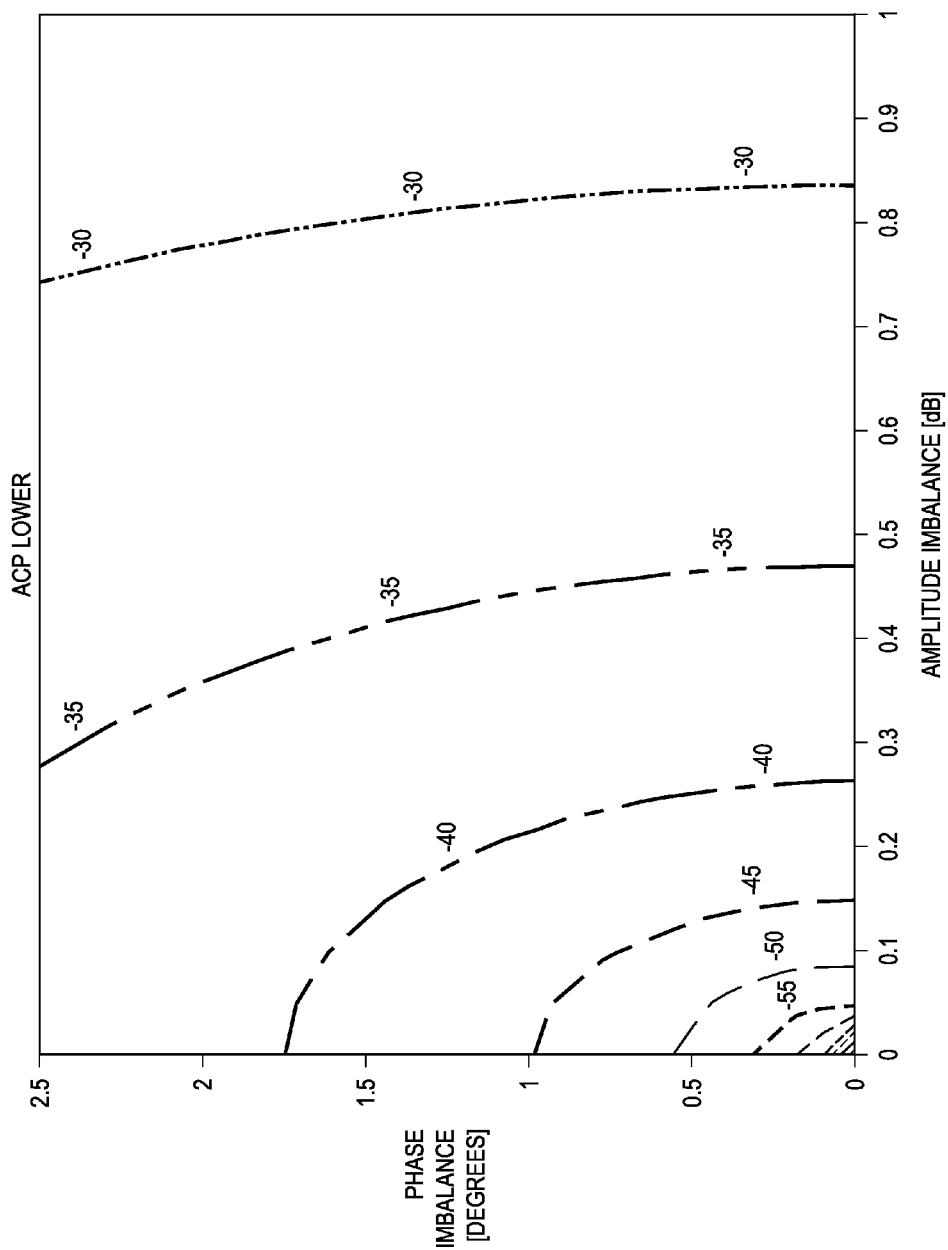
FIG. 4 illustrates adjacent (lower) channel power (ACP) with phase imbalance and amplitude imbalance.

However, any impairment imbalance between the S1 and S2 paths can prevent the decomposed signals from ideally combining to recreate the input envelope modulation. As shown in FIG. 2, the impairment can be modeled as a simple complex gain imbalance between the constant envelope signal paths. This is shown by adding the block a to the S1 signal path prior to the amplifier. The small amplitude or phase imbalance between the decomposed paths can lead to significant output signal degradation for in-bound and outbound frequencies. FIGS. 3 and 4 show contours of output signal error vector magnitude (EVM) (in %) and adjacent (lower) channel power (ACP), respectively, with phase imbalance and amplitude imbalance.

Figure 5:
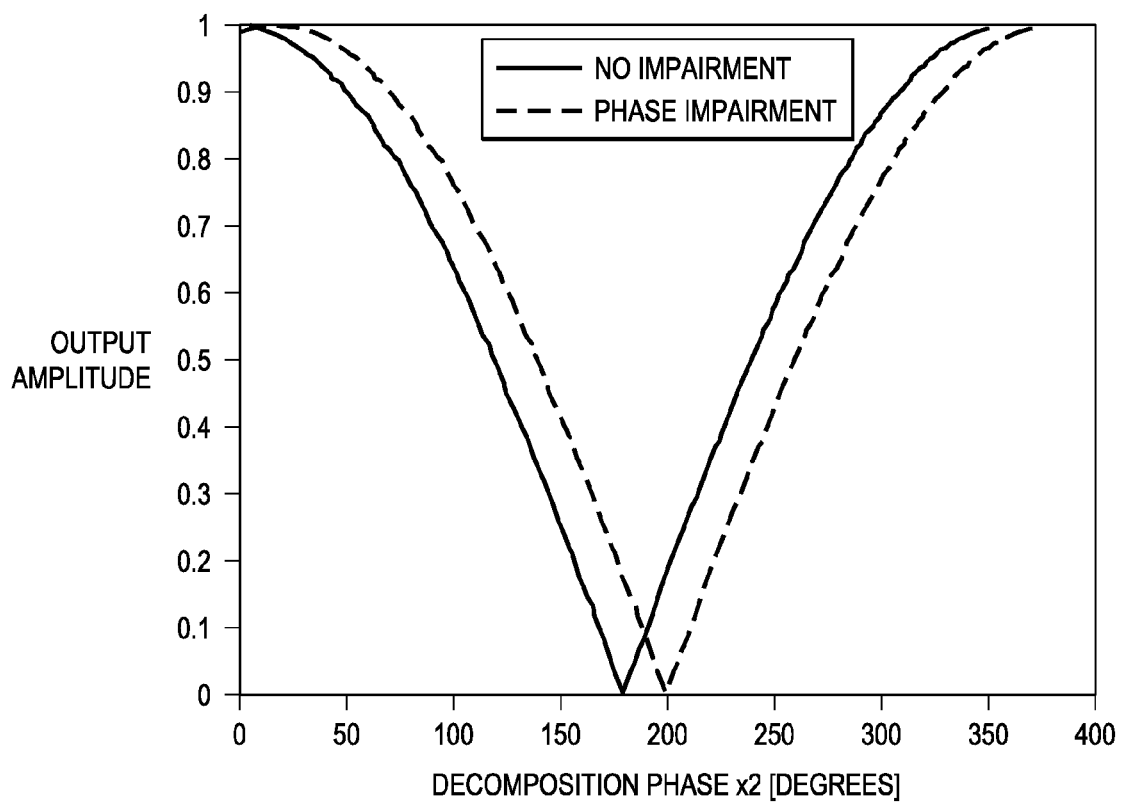
FIG. 5 illustrates output amplitude vs. decomposition phase with no impairment and with phase impairment.
Figure 6:
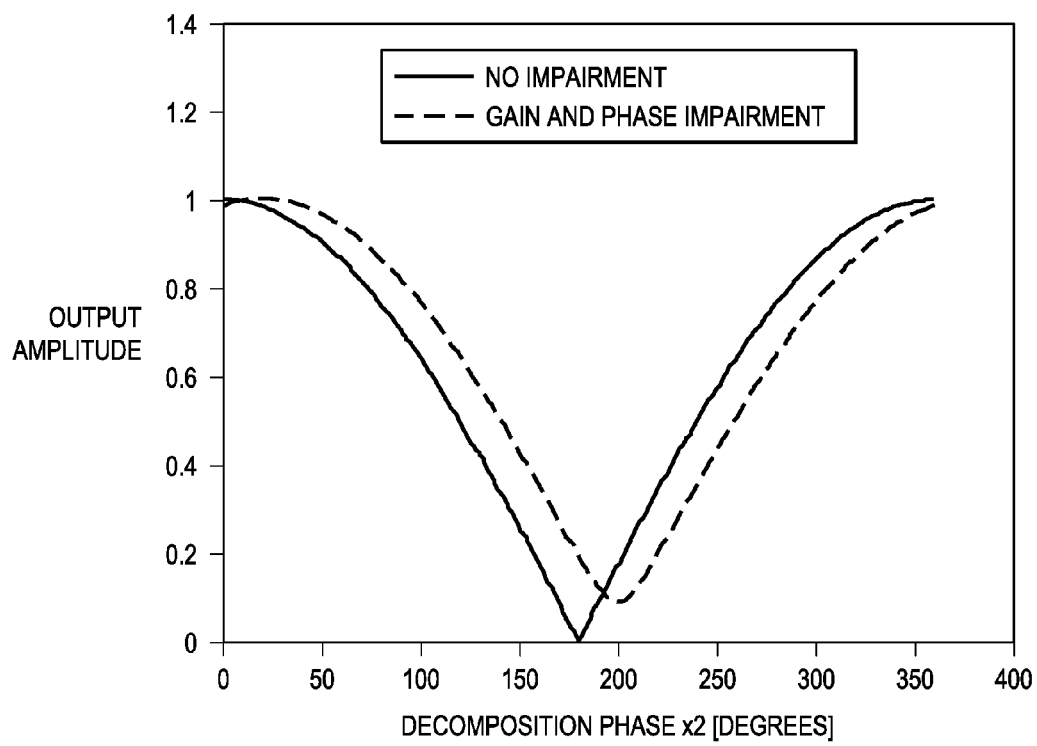
FIG. 6 illustrates output amplitude vs. decomposition phase with no impairment and with both gain and phase impairment.

FIG. 5 shows the output amplitude vs. the decomposition phase with no impairment and with phase impairment. As shown, the phase only impairment just shifts the curve (standard arc-cosine curve). In this case, the null (minimum) and peak are achievable. FIG. 6 shows the output amplitude vs. the decomposition phase with no impairment and with both gain and phase impairment. As shown, the gain and phase imbalance shifts the position of the peak and the null, but also affects the ability to recreate the absolute minimum of the input signal. In this case, the null is not achievable at output. A plurality of options may be considered to retrieve the null point. The options include modifying hardware, modifying bias voltages, and hole punching the input signal to the level that can be recreated after the output combiner. According to the hole punch algorithm, the input minimum can be limited to the minimum (dip) of the curve corresponding to the gain with impairment. The curve hence represents a look-up-table for decomposition mapping of input magnitude to signal separation phase.

If there is a gain imbalance between the signal decomposition paths, the output of the combiner does not provide an accurate signal null value (after amplification). This imbalance may not be corrected using signal processing prior to the signal separation block. The imbalance is accounted for within or after the signal separation block using the hole punch algorithm, also referred to herein as the null-fill algorithm. According to the algorithm, the input signal minimum value is limited to a fixed threshold to eliminate a "zero" null situation, which may improve the system's ability to recreate a null at the output.

Figure 7:
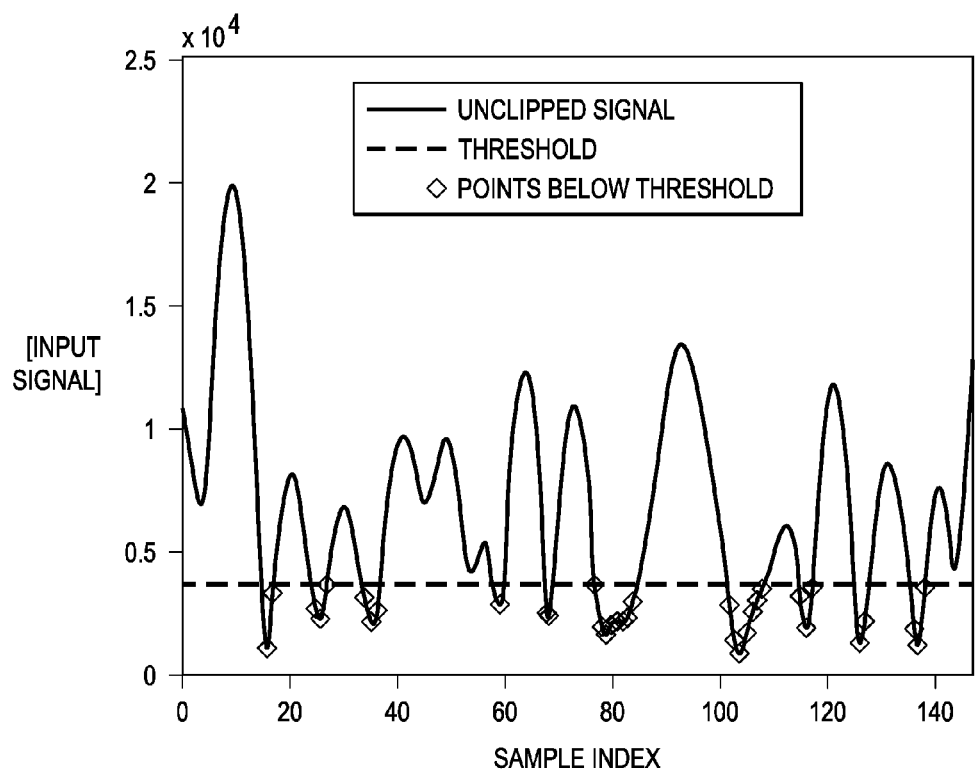
FIG. 7 illustrates samples identified below a threshold using a null-fill algorithm in accordance with an embodiment of the disclosure.
Figure 8:
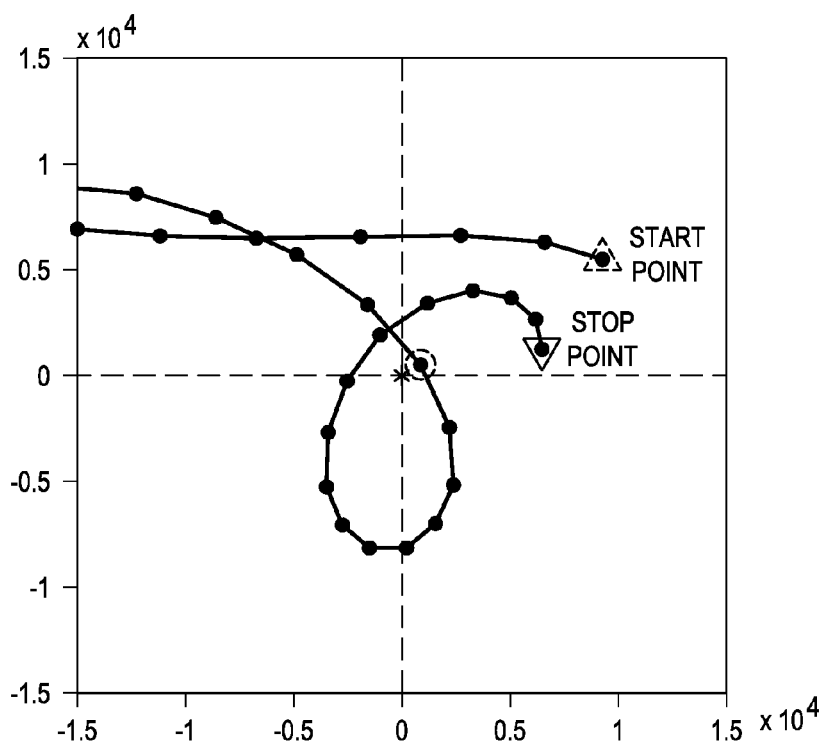
FIG. 8 illustrates a sample closest to zero identified using the null-fill algorithm.
Figure 9:
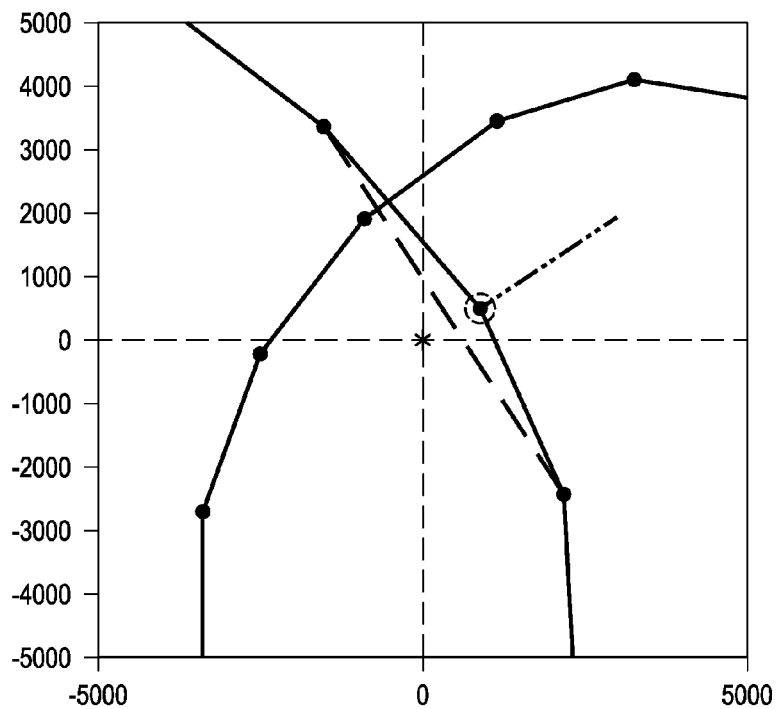
FIG. 9 illustrates a null-fill noise signal obtained using the null-fill algorithm.
Figure 10:
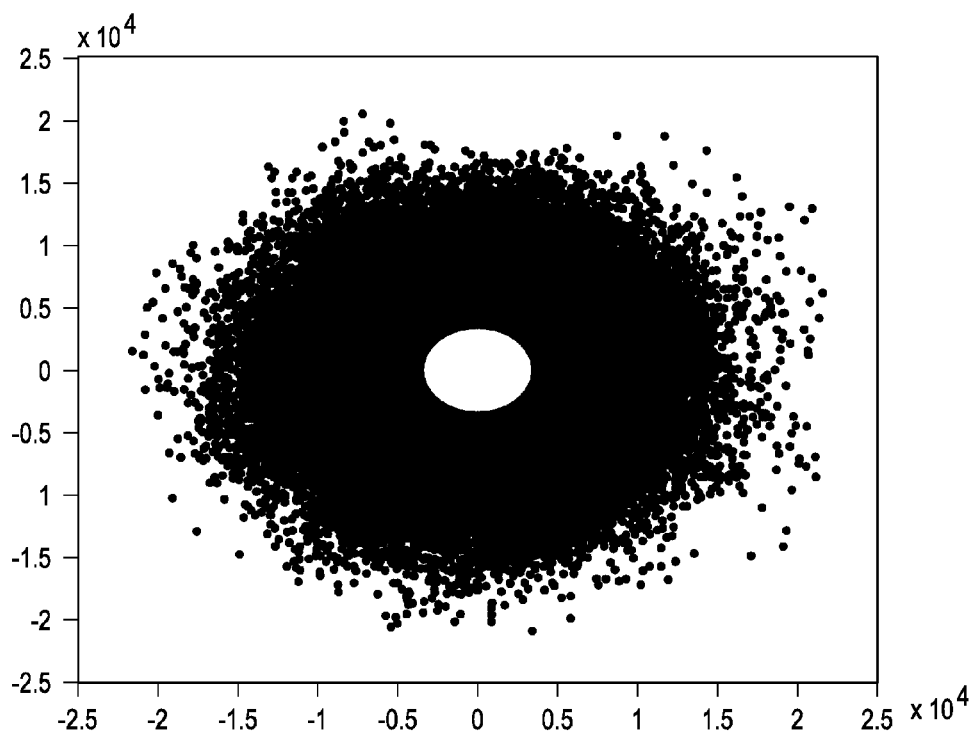
FIG. 10 illustrates a filtered noise signal added to an input signal in accordance with the null-fill algorithm.

FIGS. 7-10 illustrate examples of data obtained by performing various steps of a null-fill algorithm according to an embodiment of the disclosure. FIG. 7 shows samples identified below a threshold in a step of the null-fill algorithm. The threshold can be calculated as an average of signal amplitude over time, a peak signal, a percentage of average amplitude, or may be any suitable determined value, as described below. FIG. 8 shows a sample closest to zero identified in the IQ plane, in a next step of the algorithm. FIG. 9 shows a null-fill noise signal, also referred to as an error function, as obtained in another step of the algorithm. In this step, an offset from the closest point to zero is determined according to the threshold. In an embodiment, the direction of the offset is orthogonal to a line linking the two closest point to that point. The input signal samples are then "pushed", in the IQ plane, in this direction and by the determined offset. In other embodiments, other suitable noise signals or error functions can be used to push the input signal samples accordingly. The added signal should be filtered appropriately to ensure that out-of-band emissions are not degraded. At a fourth step, the "null-fill" noise signal is filtered to limit out-of-band emissions. FIG. 10 shows a filtered noise signal (or error function) added to the input signal (and prior to the decomposition stage in the LINC architecture) in a next step of the algorithm. As shown, adding the error function to the original signal results in a gap in the middle of the grouping of signals points in the IQ plane. The gap is proportional to the threshold used to determine the error function. This gap is an indication of the null-fill or hole punch implementation. The steps can be repeated as needed to improve the signal and achieve a suitable output in terms quality, e.g., EVM or in-band noise, out-of-band noise, or other system design requirements.

Figure 11:
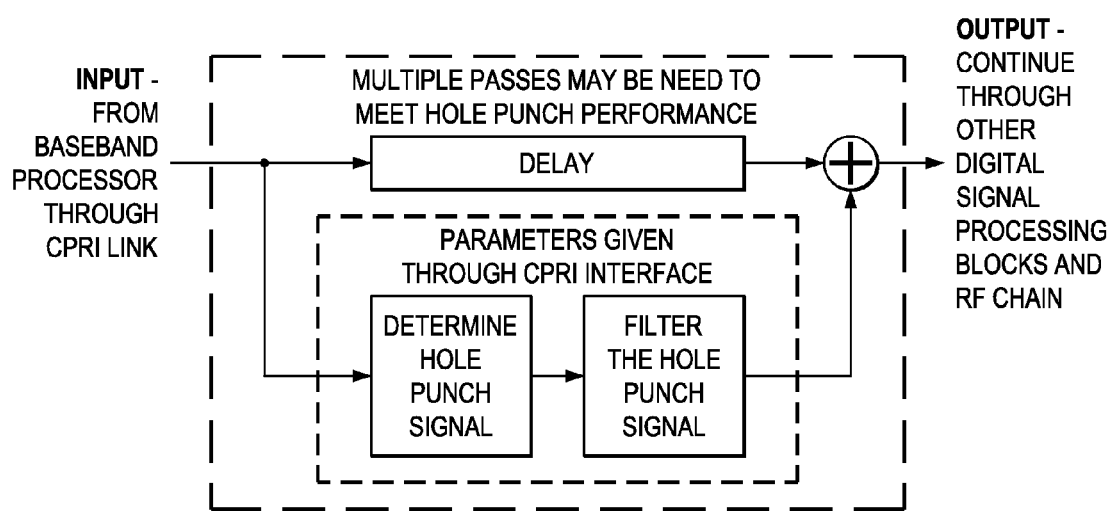
FIG. 11 illustrates an embodiment system bock for implementing the null-fill algorithm.

FIG. 11 shows an embodiment of a system block for implementing the null-fill (or hole punch) algorithm. The algorithm can be implemented in a system block positioned between a baseband processor on one side and other digital signal processing blocks and a radio frequency (RF) chain on another side, as shown. The input signal from the baseband processor is forwarded unchanged and delayed on one path in the system block. On a second path of the system block, the input signal is used to determine the hole punch signal (the error function) which is then filtered and added to the input signal on the first path. The resulting signal is then forwarded to the subsequent digital signal processing blocks and RF chain.

The error vector (or error function) can be a free-running operation within the radio baseband processing unit (such as FPGA or ASIC). The operation can be parameterized and configurable to different carrier configurations and hole punch levels, e.g., in an analogous methodology to the crest factor reduction operation. The hole punching algorithm can be performed entirely within the radio baseband FPGA or ASIC and can be parameterized appropriately such that Common Public Radio Interface (CPRI) based signaling can change the algorithm parameters.

Figure 12A:
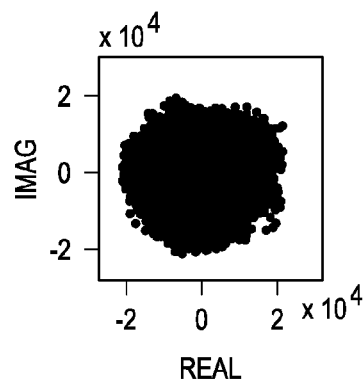
FIGS. 12a to 12c illustrate example results according to the hole punch algorithm.
Figure 12B:
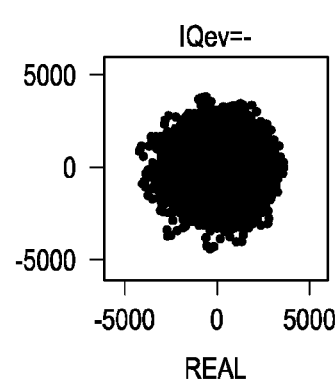
Figure 12C:
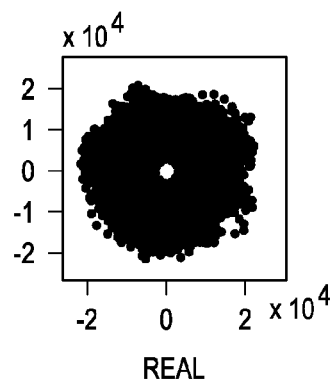
Figure 14:
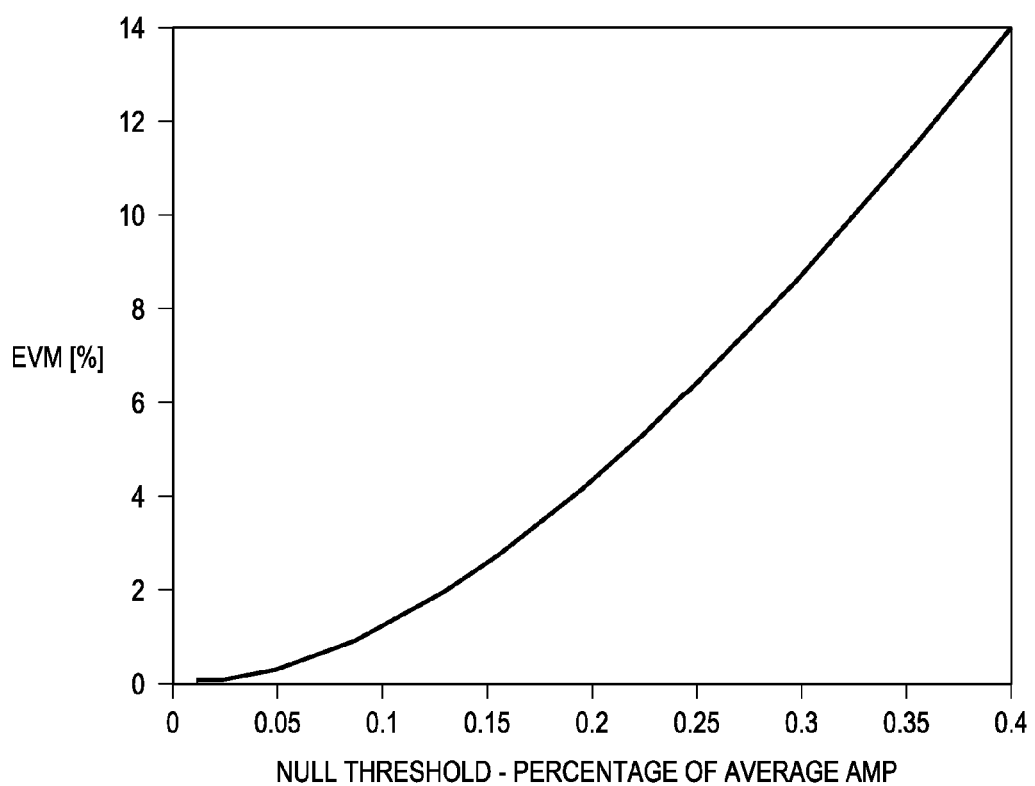
FIG. 14 illustrates the proportional the relation between the output signal EVM vs. the null threshold.
Figure 13:
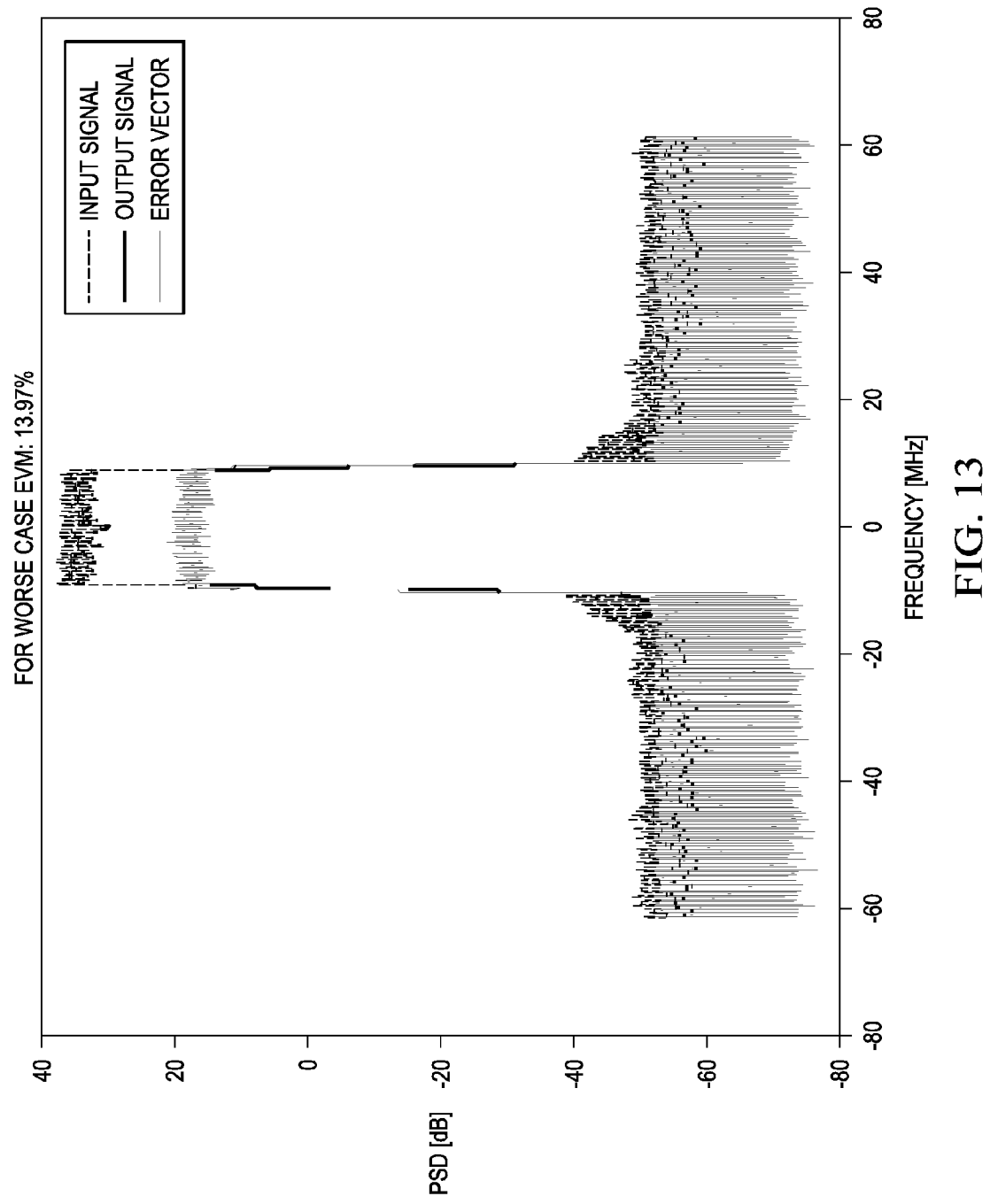
FIG. 13 illustrates PSD vs. frequency in the results of FIGS. 12a to 12c.
Figure 15:
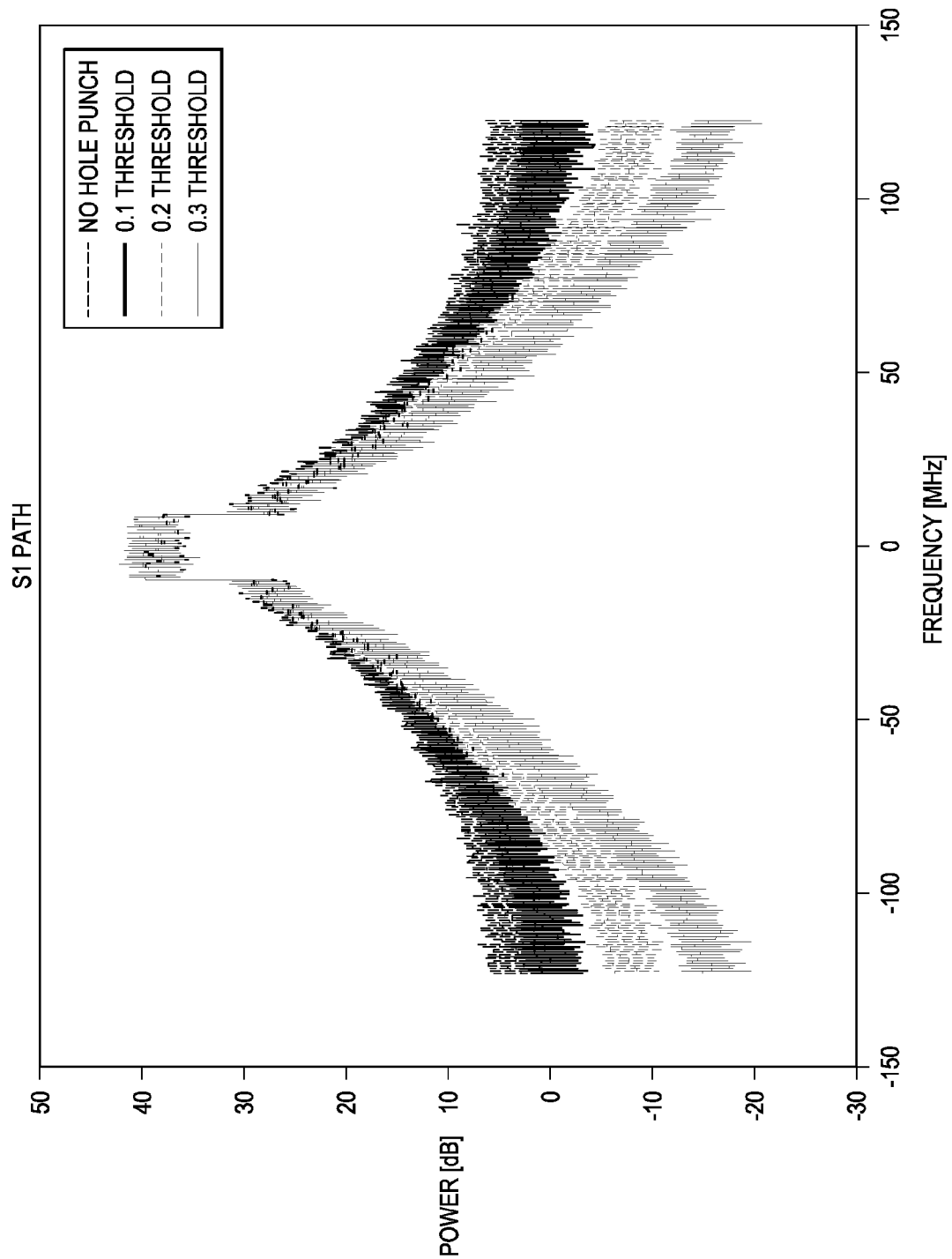
FIGS. 15 and 16 illustrate output power vs. frequency in two signal paths, decomposed from an input signal, with varying hole punch threshold values.
Figure 16:
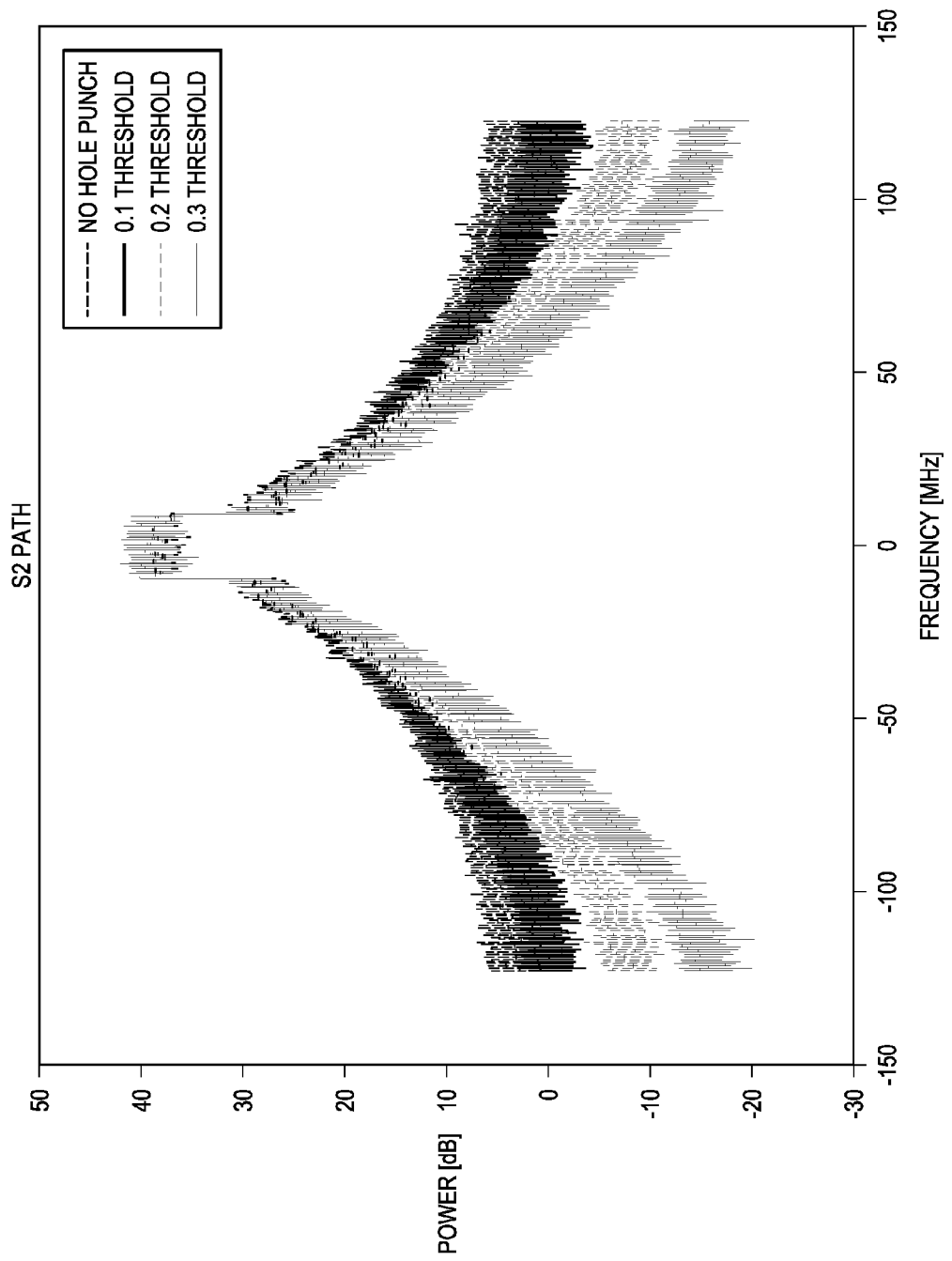

FIGS. 12a-12c is one example of results according to the algorithm. FIG. 12a shows the original signal, FIG. 12b shows the signal with the added error function (with null-fill), and FIG. 12c shows the difference (or error) between the two. FIG. 13 compares the PSD vs. frequency in the three signals above. The difference signal has an output signal EVM of about 13.97% which is proportional to the threshold considered to determine the error function. If the EVM is not acceptable in the system design, then the threshold can be adjusted (or reduced) and the error function is hence modified accordingly. FIG. 14 shows the proportional relation between the output signal EVM (in %) vs. the null threshold (calculated as a percentage of average signal amplitude). FIGS. 15 and 16 show the impact of the null-fill algorithm on decomposed signal bandwidth for S1 and S2, respectively. For small (~10%) thresholds, the bandwidth of S1 and S2 are not significantly changed. Specifically, the output signal power in dB vs. frequency is shown for S1 and S2 at different scenarios: without hole punching and with hole punching for varying threshold values. The curves show no significant change in the in-band output signal with varying threshold. A larger threshold has a more significant impact but there is a limit in choosing this value by the EVM impact. A proper threshold value for null filling (or hole punching) should be selected according to a desired EVM or other system design requirements as described above.

Figure 17:
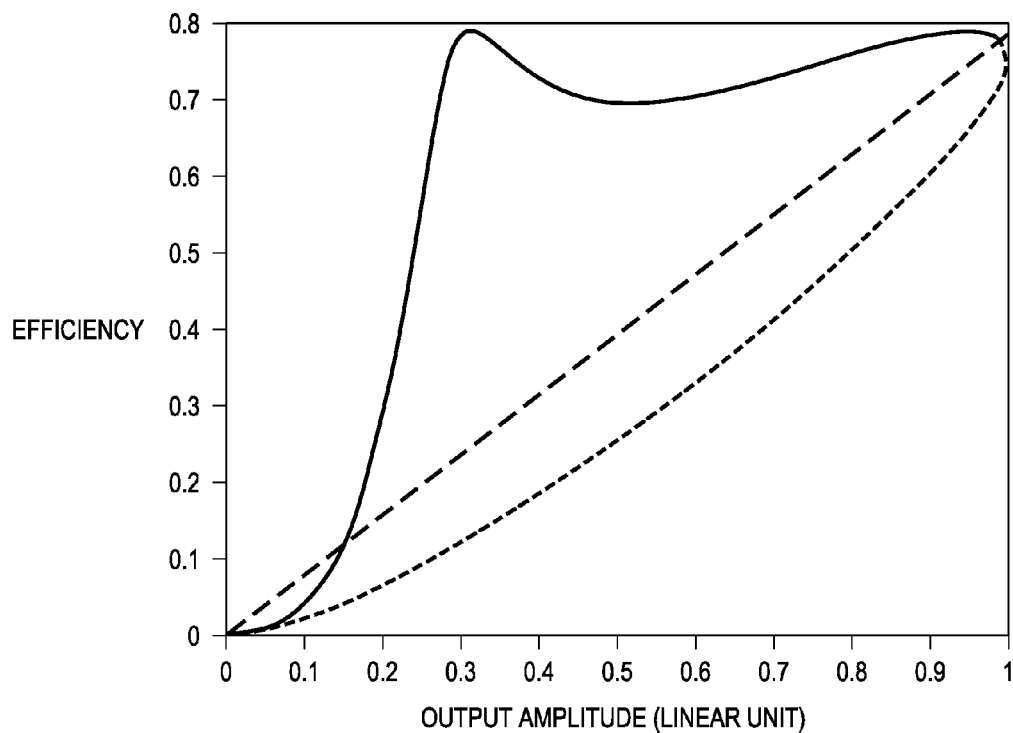
FIG. 17 illustrates an efficiency constraint in the LINC architecture.
Figure 18:
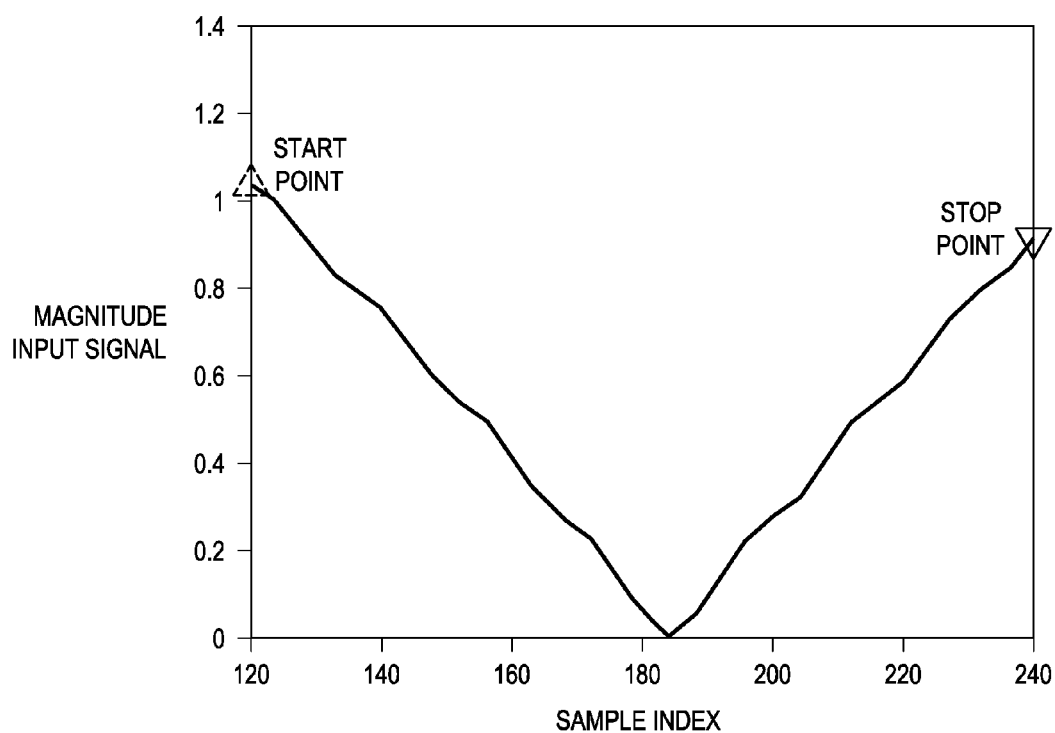
FIG. 18 illustrates output amplitude vs. a sampling of the decomposition phase.
Figure 19:
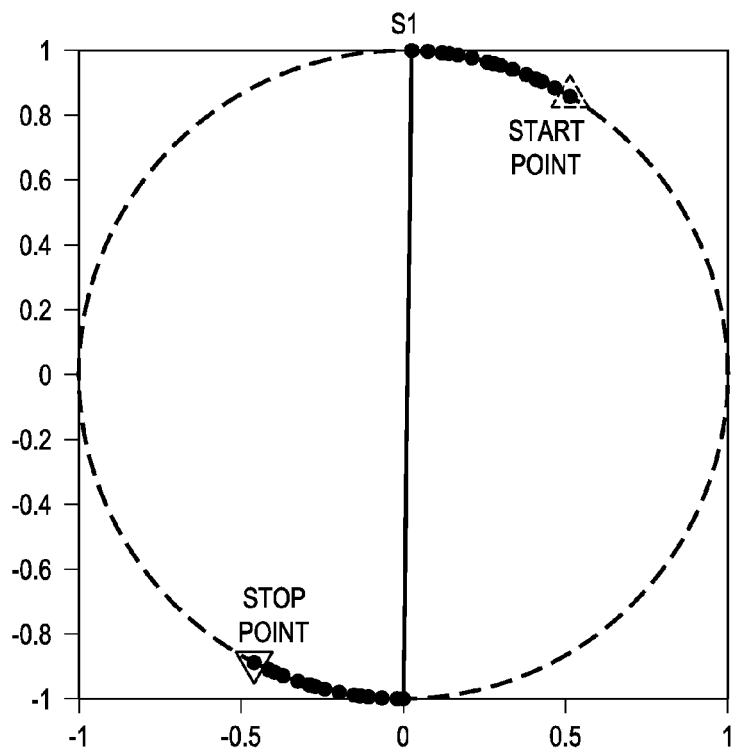
FIGS. 19 and 20 illustrate a phase transition at the null point for a first signal path and a second signal path, respectively, decomposed from an input signal.
Figure 20:
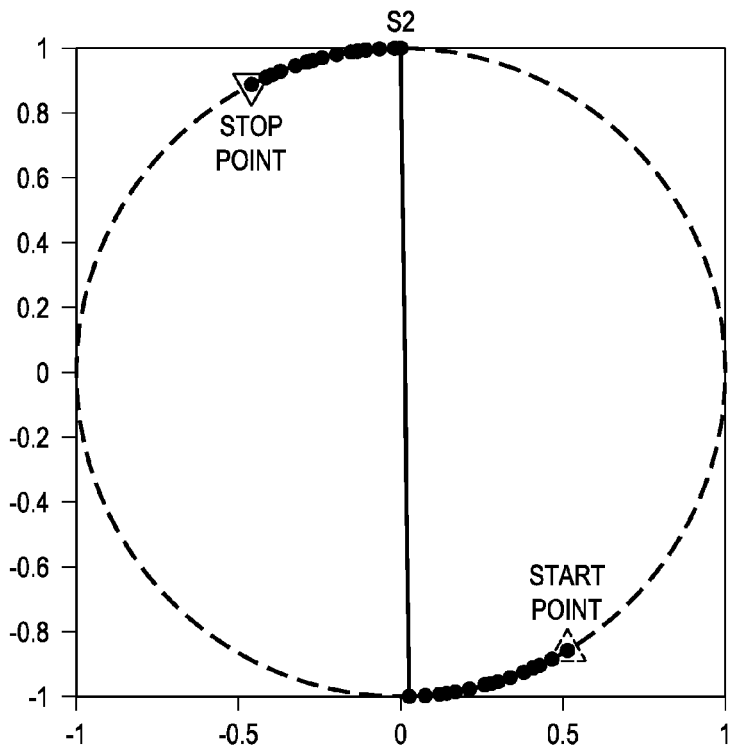

In the LINC architecture, the phase relationship of the decomposed signals, S1 and S2, should be maintained as the input amplitude is changed in order to achieve better efficiency. As shown in FIG. 17, the correct phase relationship should be maintained to keep the efficiency high. FIG. 18 shows the output amplitude vs. a sampling of the decomposition phase. According to this relation, there is a rapid phase change for S1 and S2 as the input signal goes through a null, as shown in FIGS. 19 and 20 for S1 and S2, respectively.

Figure 21:
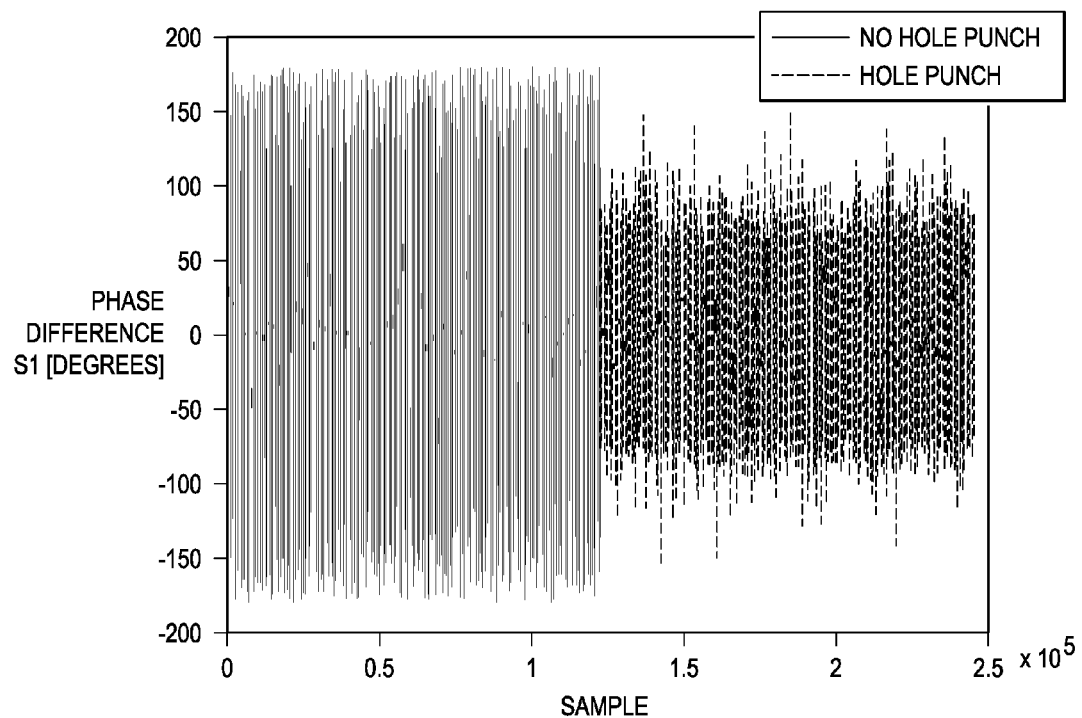
FIG. 21 illustrates phase difference with hole punch algorithm.
Figure 22:
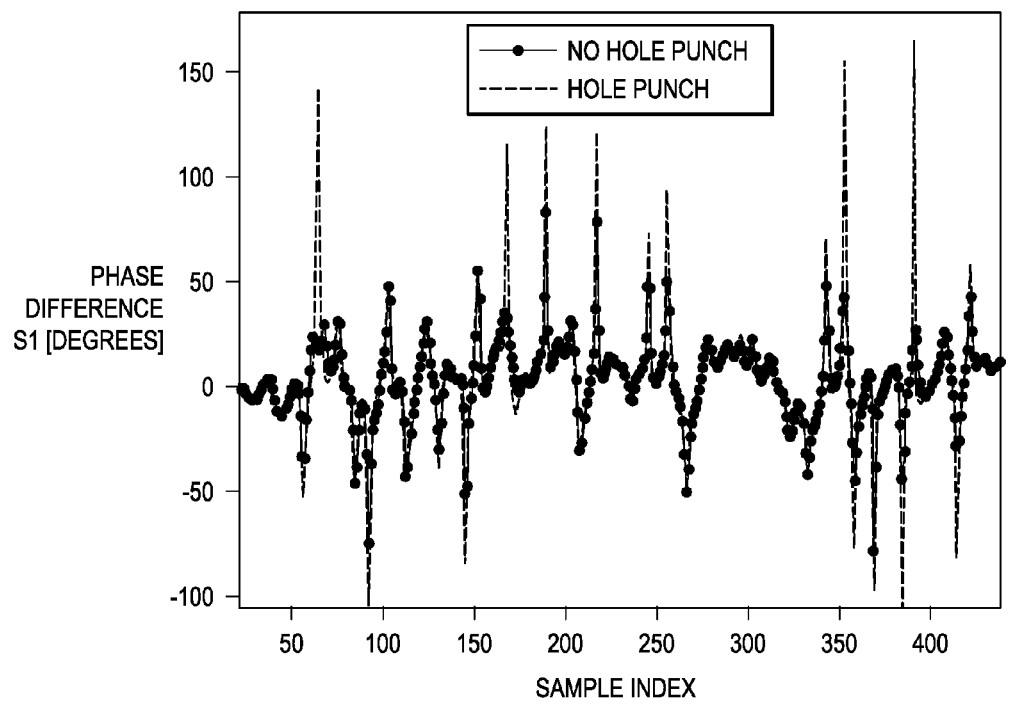
FIG. 22 illustrates phase difference with hole punch algorithm.

The hole punch (or null-fill) algorithm can be used to limit the phase transitions. Another observation is that the transition of S1 and S2, as the zero is approached, is smooth and gradual when the hole punch is applied, as shown in FIGS. 21 and 22. By using the hole punch algorithm, the instantaneous frequency changes on S1 and S2 are reduced. This may be beneficial for future linearization algorithms.

Figure 23:
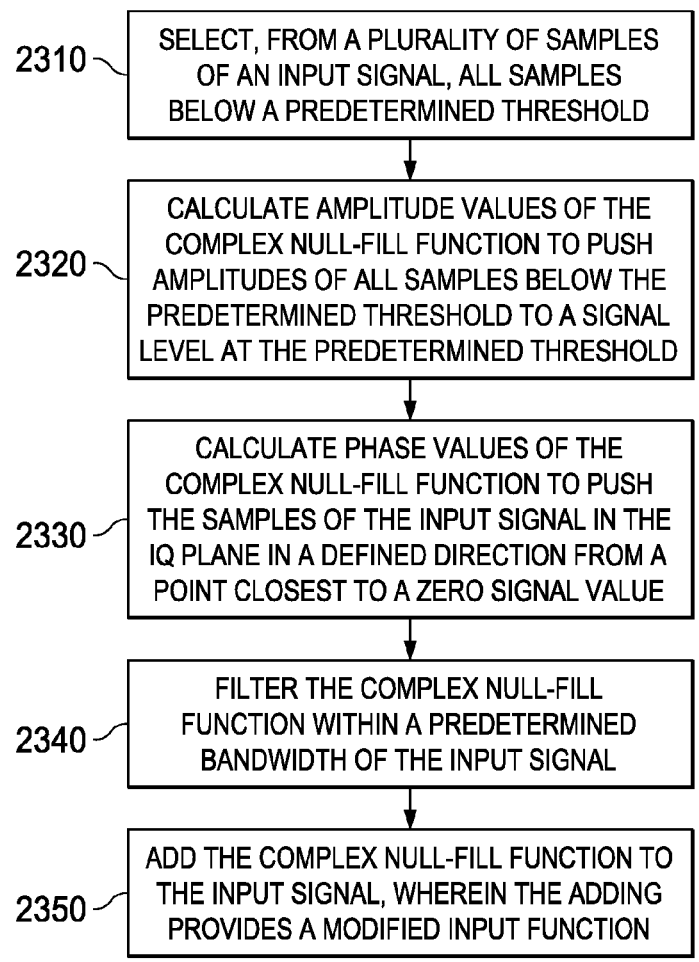
FIG. 23 illustrates an embodiment method for handling a null signal in a power amplifier.

FIG. 23 illustrates an embodiment method for handling a null signal in a power amplifier. At step 2310, a plurality of samples below a predetermined threshold is selected from a plurality of samples of an input signal. At step 2320, amplitude values of the complex null-fill function are calculated. The amplitude values of the complex null-fill function are calculated to push the amplitudes of all samples below the predetermined threshold to a signal level at the predetermined threshold. At step 2330, the phase values of the complex null-fill function are calculated to push the samples of the input signal in the IQ plane in a defined direction from a point closest to a zero signal value. In an embodiment, the phase calculation comprises identifying in the IQ plane two most adjacent points to the point closest to the zero signal value, and determining the phase values to push the points in a direction orthogonal to a straight line between the two most adjacent points. At step 2340, the complex null-fill function is filtered within a predetermined bandwidth of the input signal to reduce out-of-band emissions. At step 2350, the complex null-fill function is added to the input signal, thereby providing a modified input function.

Figure 24:
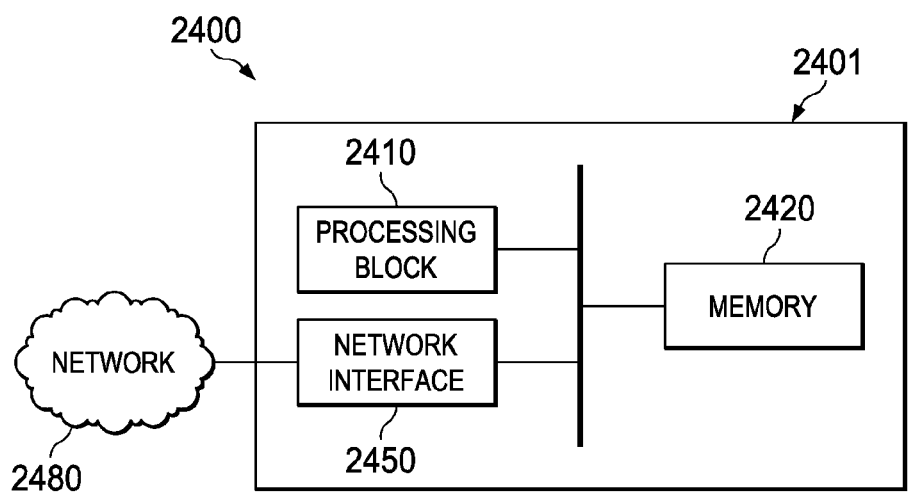
FIG. 24 is a diagram of a processing system that can be used to implement various embodiments.

FIG. 24 is a block diagram of an exemplary processing system 2400 that can be used to implement various embodiments. For example, the processing system 2400 can comprise or be part of the system block for implementing the null-fill (or hole punch) algorithm, e.g., in a transmitter/receiver (transceiver) network component. Specific devices may utilize all of the components shown, or only a subset of the components and levels of integration may vary from device to device. Furthermore, a device may contain multiple instances of a component, such as multiple processing units, processors, memories, transmitters, receivers, etc. The processing system 2400 may comprise a processing unit 2401 which may include a processor 2410 such as a central processing unit (CPU), a memory 2420, a mass storage device 2430, and a network interface 2450. The processor 2410 may comprise any type of electronic data processor. Additionally or alternatively, the processing block may comprise a field-programmable gate array (FPGA) and/or an application-specific integrated circuit (ASIC). The memory 2420 may comprise any type of temporary or long-term storage memory devices or combinations thereof. For example, the memory 2420 can include Random Access Memory (RAM), FLASH memory, solid state memory, or other types of memory devices. The memory 2420 and the processor 2410 may be separate components or may be integrated into one component, chip, or circuit.

The processing unit 2401 also includes one or more network interfaces 2450, which may comprise wired links, such as an Ethernet cable or the like, and/or wireless links to access nodes or one or more networks 2480. The network interface 2450 allows the processing unit 2401 to communicate with remote units via the networks 2480. For example, the network interface 2450 may provide wireless communication via one or more transmitters/transmit antennas and one or more receivers/receive antennas. In an embodiment, the processing unit 2401 is coupled to a local-area network or a wide-area network for data processing and communications with remote devices, such as other processing units, the Internet, remote storage facilities, or the like. Other devices may be coupled to the processing unit, and additional or fewer interface cards may be utilized.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A method by a signal processor for handling a null signal in a power amplifier, the method comprising:
    determining a minimum threshold value of an input signal to a power amplifier, wherein the minimum threshold value is retrievable with a defined error in an output signal of the power amplifier;
    generating an offset function according to the minimum threshold value;
    filtering the offset function within a predetermined bandwidth of the input signal; and
    adding the filtered offset function to the input signal prior to amplifying the input signal.

2. The method of claim 1, wherein the offset function is added to the input signal after baseband signal processing and digital signal processing and before radio frequency (RF) signal processing.

3. The method of claim 1, wherein the offset function is generated in accordance with a predetermined error vector magnitude (EVM) level of the output signal and signal design requirement.

4. The method of claim 1, wherein generating the offset function includes:
    selecting, in the input signal, a plurality of points below the minimum threshold value; and
    determining amplitude values of the offset function to raise amplitude values of the points to the minimum threshold value.

5. The method of claim 1, wherein generating the offset function includes:
    representing the input signal in an IQ plane;
    identifying, in the IQ plane, a point closest to a zero signal value in an IQ plane;
    identifying, in the IQ plane, two most adjacent points to the point closest to the zero signal value; and
    determining phase values of the offset function to push samples of the input signal in the IQ plane in a direction orthogonal to a straight line between the two most adjacent points.

6. The method of claim 1 further comprising repeating steps of generating the offset function until the offset function or the output signal is within a defined error level.

7. A method by a power amplifier circuit for handling a null signal in a power amplifier, the method comprising:
    identifying, from a plurality of samples of an input signal, samples below a predetermined threshold;
    calculating amplitude values of a complex null-fill function to raise amplitudes of the identified samples to a signal level at the predetermined threshold;
    calculating phase values of the complex null-fill function to push, in an IQ plane, the samples of the input signal in a defined direction from a point closest to a zero signal value;
    filtering the complex null-fill function with the calculated amplitude values and phase values within a predetermined bandwidth of the input signal; and
    adding the filtered complex null-fill function to the input signal, wherein the adding provides a modified input signal.

8. The method of claim 7 further comprising:
    decomposing the modified input signal into a plurality of constant envelope signals;
    amplifying the constant envelope signals separately; and
    combining the amplified constant envelope signals, wherein the combining provides an amplified output signal.

9. The method of claim 7 further comprising:
    splitting the input signal into two similar input signals;
    calculating the complex null-fill function by processing a first signal of the two similar input signals;
    delaying a second signal of the two similar input signals; and
    generating the modified input signal by adding the complex null-fill function to the delayed second signal.

10. The method of claim 7 further comprising repeating steps of calculating the phase values of the complex null-fill function until the complex null-fill function is within a predetermined error level.

11. The method of claim 7, wherein calculating the phase values of the complex null-fill function includes:
    identifying, in the IQ plane, two most adjacent points to the point closest to the zero signal value; and
    calculating the phase values of the complex null-fill function that push the samples of the input signal in a direction orthogonal to a straight line connecting the two most adjacent points.

12. A power amplifier circuit for handling a null signal, the power amplifier comprising:
    a signal processor configured to determine a minimum threshold value of an input signal, wherein the minimum threshold value is retrievable with a defined error in an output signal of the power amplifier, and generate an offset function according to the minimum threshold value;
    a noise filter coupled to the signal processor, and configured to filter the offset function within a predetermined bandwidth of the input signal, wherein the filtering reduces out-of-band emissions in the output signal; and
    a signal coupler coupled to the noise filter, and configured to add the filtered offset function to the input signal, and provide a modified input signal.

13. The power amplifier circuit of claim 12 further comprising:
    a signal separator configured to separate the modified signal into a first constant envelope signal on a first path and a second constant envelope signal on a second path;
    a first power amplifier coupled to the first path;
    a second power amplifier coupled to the second path; and
    a signal combiner coupled to the first amplifier and the second amplifier and configured to combine outputs of the first power amplifier and the second power amplifier, and provide the output signal.

14. The power amplifier circuit of claim 12 further comprising a delay circuit coupled to the coupler, and configured to delay the input signal prior to adding the filtered offset function to the input signal at the coupler.

15. The power amplifier circuit of claim 12, wherein the signal processor is positioned on a signal path after baseband processing and other digital signal processing blocks and before a radio frequency (RF) operation block.

16. The power amplifier circuit of claim 12, wherein the signal processor is further configured to:
   select, in the input signal, a plurality of points below the minimum threshold value; and
   determine amplitude values of the offset function to raise amplitudes of the points to the minimum threshold value.

17. The power amplifier circuit of claim 12, wherein the signal processor is further configured to:
   identify, in an IQ plane, a point closest to a zero signal value in an IQ plane;
   identify, in the IQ plane, two most adjacent points to the point closest to the zero signal value; and
   determine phase values of the offset function to push, in the IQ plane, samples of the input signal in a direction orthogonal to a straight line connecting the two most adjacent points.

18. The power amplifier circuit of claim 12, wherein the signal processor is further configured to repeat steps of generating the offset function until the offset function or the output signal is within a defined error level.

19. The power amplifier circuit of claim 12, wherein the power amplifier circuit is part of a transceiver device for wireless communications.

* * * * *